United States Patent [19]
Schrader

[11] Patent Number: 5,523,715
[45] Date of Patent: Jun. 4, 1996

[54] AMPLIFIER ARRANGEMENT AND METHOD AND VOLTAGE CONTROLLED AMPLIFIER AND METHOD

[76] Inventor: Daniel J. Schrader, Rte. 2, Box 89, Rogersville, Mo. 65742

[21] Appl. No.: 401,873

[22] Filed: Mar. 10, 1995

[51] Int. Cl.⁶ .................................................. H03F 3/38
[52] U.S. Cl. .................................. 330/10; 381/96
[58] Field of Search ........................... 330/10, 59, 136, 330/207 A, 251; 381/96, 120

[56] References Cited

U.S. PATENT DOCUMENTS

| | | | |
|---|---|---|---|
| 2,948,778 | 8/1960 | Clements | 381/96 |
| 3,798,374 | 3/1974 | Meyers | 381/96 |
| 3,872,247 | 3/1975 | Saville | 330/138 X |
| 3,889,060 | 6/1975 | Goto | 381/96 |
| 4,176,305 | 11/1979 | Cuno | 381/121 X |
| 4,256,923 | 3/1981 | Meyers | 381/96 |
| 4,276,443 | 6/1981 | Meyers | 381/96 |
| 4,316,060 | 2/1982 | Adams | 381/98 |
| 4,327,250 | 4/1982 | von Recklinghausen | 330/85 X |
| 4,340,780 | 7/1982 | Odlen | 333/28 R X |
| 4,395,588 | 7/1983 | Franssen | 381/96 |
| 4,415,863 | 11/1983 | Tokumo | 330/10 |
| 4,455,675 | 6/1984 | Bose et al. | 381/74 |
| 4,550,430 | 10/1985 | Meyers | 381/96 |
| 4,598,417 | 7/1986 | Deno | 381/67 |
| 4,600,891 | 7/1986 | Taylor et al. | 330/10 |
| 4,868,870 | 9/1989 | Schrader | 381/96 |
| 5,381,109 | 1/1995 | Cripe et al. | 330/10 |

FOREIGN PATENT DOCUMENTS

| | | |
|---|---|---|
| 2413009 | 8/1979 | France . |
| 879560 | 6/1953 | Germany . |
| 57-199396 | 12/1982 | Japan . |
| 1585759 | 3/1981 | United Kingdom . |

OTHER PUBLICATIONS

National Semiconductor, LB-8-1, Aug. 1969, "Precision AC/DC Converters".
Lancaster, Active Filter Cookbook, 1979, p. 204.

*Primary Examiner*—Steven Mottola
*Attorney, Agent, or Firm*—Ostrolenk, Faber, Gerb & Soffen

[57] ABSTRACT

An amplifier arrangement include a control circuit having an audio input and a control input, the control circuit producing an error signal proportional to the difference between the audio input and the control input; a comparator receiving the error signal as an input and having a first reference signal as an input and producing a comparator output signal comprising a gain control signal for an amplifier circuit; an amplifier circuit having the audio signal as an input and further having a gain responsive to the comparator output signal, the amplifier circuit having an output; a pulse width modulator circuit having the amplifier circuit output as an input, the pulse width modulator circuit converting an amplified audio signal comprising the output of the amplifier circuit into a pulse width modulated signal whose duty cycle represents audio information in the audio signal; a power amplifier switching circuit receiving the pulse width modulated output signal, the output of the power amplifier switching circuit comprising an amplified pulse width modulated signal; and an output filter receiving the amplified pulse width modulated signal, the output filter converting the amplified pulse width modulated signal into an amplified audio signal substantially reproducing said input audio signal but at an increased gain and adapted to be coupled to an output transducer. Preferably, the amplifier circuit is a voltage controlled amplifier (VCA) whose gain element is an output circuit of an optocoupler, e.g., an FET of an output side of an optocoupler wherein the FET impedance is controlled to control the VCA gain.

76 Claims, 7 Drawing Sheets

AMPLIFIER ARRANGEMENT AND METHOD AND VOLTAGE CONTROLLED AMPLIFIER AND METHOD

BACKGROUND OF THE INVENTION

The present invention relates to electronic amplifiers. It furthermore relates to audio amplifiers. In particular, the invention relates to an electronic amplifier where nonlinearities of an output transducer coupled to the amplifier may be controlled and compensated. Even more particularly, the present invention relates to an amplifier arrangement having a control circuit fed by a servo mechanism disposed on the output transducer coupled to the amplifier, thereby controlling and correcting nonlinearities in the response generated by the output transducer. For example, the present invention has particular application to the control of nonlinearities generated by loudspeakers coupled to audio amplifiers.

Current audio reproduction is achieved through a system of amplification and reproduction in which the amplifier increases both voltage and current levels, while a transducer produces acoustic output by conversion of electrical energy into acoustic energy. Often the transducer, i.e., a loudspeaker, does not follow its input in linear fashion, resulting in phase, frequency, amplitude and harmonic distortion.

U.S. Pat. No. 4,868,870, issued to the present applicant, describes an amplifier system which copes with transducer nonlinearities through detection and correction of these nonlinearities.

However, that patent describes a system having a voltage controlled amplifier which can introduce some distortion characteristic, though small, of its own. The system of the present invention provides a new gain cell for a voltage controlled amplifier which has an extremely low distortion characteristic. The present invention also uses pulse width modulation techniques. Additionally, the present invention seeks to provide an amplifier arrangement which generally reduces distortion to a minimum.

SUMMARY OF THE INVENTION

It is, accordingly, an object of the present invention to provide an electronic amplifier arrangement.

It is a further object of the invention to provide an electronic amplifier arrangement which can correct amplifier gain to offset nonlinearities of the transducer coupled to the amplifier.

It is a further object of the present invention to provide an amplifier arrangement which limits amplifier distortion or transducer damage.

It is a further object of the present invention to provide an amplifier arrangement which provides improved transient response, dynamic damping and flattening of the response curve of the audio amplifier arrangement.

It is yet still a further object of the present invention to provide an audio amplifier arrangement having a feedback loop fed by a sensor disposed on the output transducer coupled to the amplifier, whereby nonlinearities in the response of the transducer can be offset by appropriate control of the amplifier arrangement by signals from the sensor.

It is yet still a further object of the present invention to provide an audio amplifier arrangement having a voltage controlled amplifier having an extremely low distortion characteristic and which provides an improvement to the device disclosed in U.S. Pat. No. 4,868,870.

It is yet still a further object of the present invention to provide an audio amplifier arrangement which provides feedback to a voltage controlled amplifier from the output stage thereby to provide further control of the gain of the voltage controlled amplifier.

It is yet still a further object of the present invention to provide an audio amplifier arrangement which provides negative feedback from an output stage to provide even further control of the gain of the amplifier arrangement.

It is a further object of the present invention generally to provide an improved system over that disclosed in U.S. Pat. No. 4,868,870.

It is yet still a further object to provide an amplifier arrangement having minimal distortion characteristics.

The above and other objects of the present invention are achieved by an amplifier arrangement comprising a control circuit having an audio input and a control input, the control circuit producing an error signal proportional to the difference between the audio input and the control input; a comparator receiving the error signal as an input and having a first reference signal as an input and producing a comparator output signal comprising a gain control signal for an amplifier circuit; an amplifier circuit having said audio signal as an input and further having a gain responsive to the comparator output signal, the amplifier circuit having an output; a pulse width modulator circuit having said amplifier circuit output as an input, the pulse width modulator circuit converting an amplified audio signal comprising the output of said amplifier circuit into a pulse width modulated signal whose duty cycle represents audio information in said audio signal; a power amplifier switching circuit receiving the pulse width modulated signal, the output of the power amplifier switching circuit comprising an amplified pulse width modulated signal; and an output filter receiving the amplified pulse width modulated signal, the output filter converting the amplified pulse width modulated signal into an amplified audio signal substantially reproducing said input audio signal but at an increased gain and adapted to be coupled to an output transducer.

The above and other objects of the invention are also achieved by an amplifier arrangement comprising a control circuit having an audio input and a control input, the control circuit producing an error signal proportional to the difference between the audio input and the control input, a comparator receiving the error signal as an input and having a first reference signal as an input and producing a comparator output signal comprising a gain control signal for an amplifier circuit, an amplifier circuit having said audio signal as an input and further having a gain responsive to the comparator output signal, the amplifier circuit having an output and comprising a voltage controlled amplifier whose gain is controlled by the comparator output, the voltage controlled amplifier comprising an optocoupler and an amplifier, the optocoupler having an input circuit and an output circuit, the input circuit and the output circuit having an electronically isolated signal path, the input circuit being coupled to the comparator output, the output circuit being coupled to the audio input and to the amplifier and comprising a gain control element for controlling the gain of the amplifier, the gain control element being controlled by the input circuit by an optical link of said optocoupler, and a power amplifier circuit receiving an output signal from said amplifier circuit, the output of the power amplifier circuit comprising an amplified signal adapted to be coupled to an output transducer.

Methods for electronic amplification and for reducing nonlinearities in the response of an output transducer coupled to an amplifier arrangement are also within the scope of the invention.

The invention also relates to a voltage controlled amplifier and method. According to the invention, the voltage controlled amplifier comprises an optocoupler whose output circuit comprises a gain control element which controls the gain of an amplifier coupled to the output of the optocoupler.

Other objects, advantages and features of the present invention will be apparent from the detailed description which follows.

BRIEF DESCRIPTION OF THE DRAWINGS

The present invention will be described in the following detailed description with reference to the drawings in which.

DETAILED DESCRIPTION OF THE INVENTION

Figure 1:
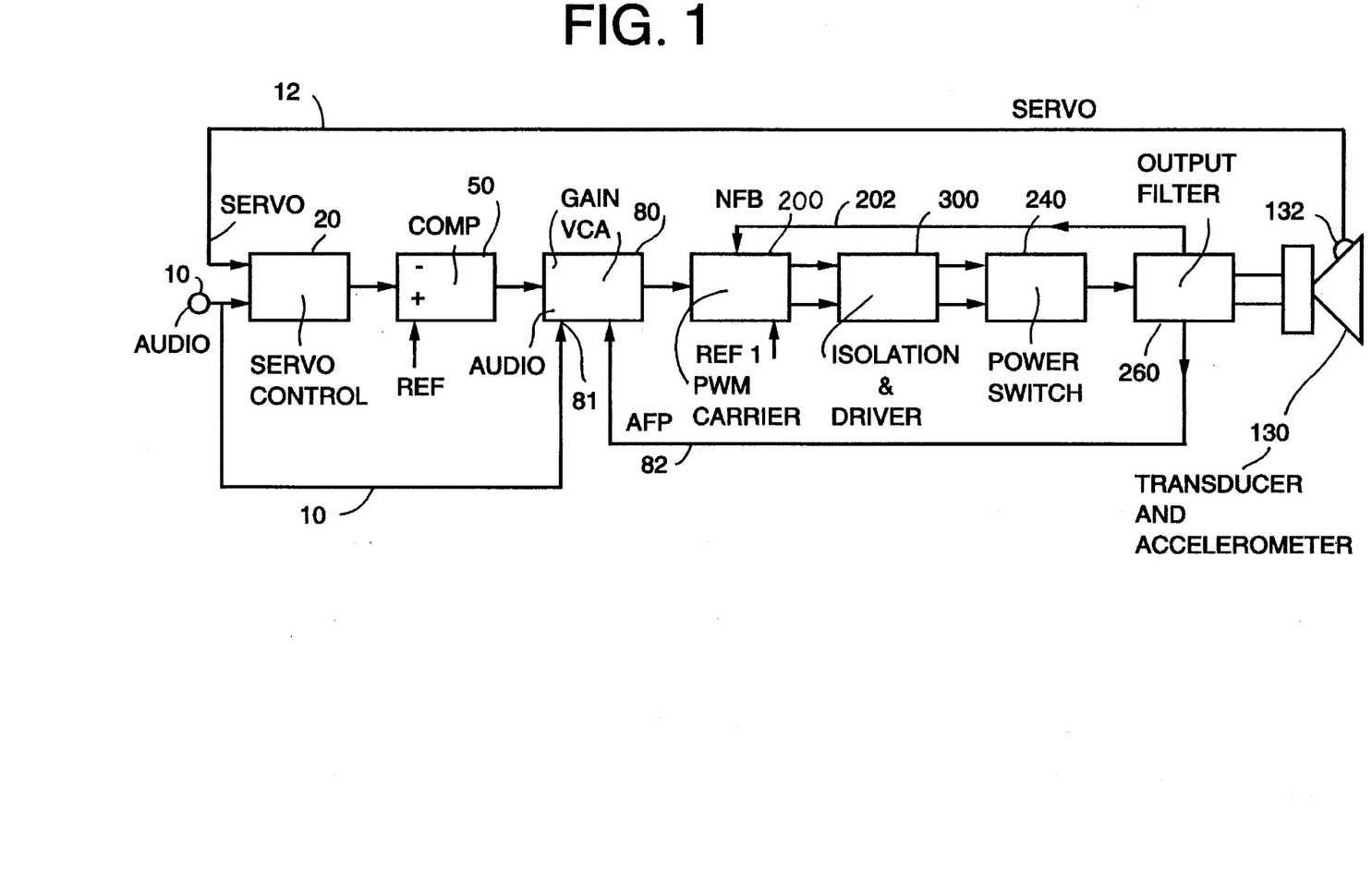
FIG. 1 is a block diagram of the amplifier arrangement according to the present invention.

With reference now to the drawings, FIG. 1 shows the basic block diagram of an embodiment of an audio amplifier according to the present invention. As shown, the amplifier arrangement comprises an audio input coupled to a servo-control circuit which comprises precision rectifiers, to be explained further with reference to FIG. 2. The precision rectifiers of the servo-control circuit are similar to those shown in U.S. Pat. No. 4,868,870. The servo control circuit 20 also has a servo control input 12.

The output of the servo-control circuit 20 is coupled to a comparator 50. An output from a servo sensor, for example, an accelerometer 132 mounted on the output transducer 130, is fed to input 12 of the servo-control circuit 20. Sensor 132 provides a signal proportional to the movement of a moving member of the transducer, i.e., the voice coil of loudspeaker 130, and in particular, the acceleration of the voice coil.

In the control circuit 20, both the audio input signal 10 and the servo-signal 12 from accelerometer 132 are full wave rectified and a signal produced at the output thereof proportional to the difference between the audio input signal and the servo-signal from accelerometer 132. Accordingly, servo control circuit 20 converts both the servo-input signal and the audio input signal to pulsating DC signals. A signal proportional to the difference between these DC signals is supplied as an output control signal which is fed to comparator 50 wherein the control signal is compared to a fixed reference value.

The output of comparator 50 is then fed as an error control signal to the control input of a voltage controlled amplifier 80, the audio input 81 of which is coupled to the audio input signal 10 so as to amplify the audio input signal 10. The gain control of voltage controlled amplifier 80 preferably is performed by controlling the impedance of an FET output side of an optocoupler, which may be a General Electric type H11F1. Other equivalent optocouplers can be used instead. The control signal from comparator 50 drives the gain of the voltage controlled amplifier (VCA) in a direction so as to reduce the error, thereby correcting amplifier gain to offset transducer non-linearities. Accordingly, if the accelerometer 132 produces a signal whose magnitude, after any gain adjustment, is greater than the magnitude of the audio input signal 10, as determined by the output of the control circuit 20, comparator 50 will produce an output signal to decrease the gain of voltage controlled amplifier 80, thereby offsetting the transducer non-linearity. Similarly, if the adjusted magnitude of servo signal 12 is less than the magnitude of audio input signal 10, comparator 50 will produce an output signal to increase the gain of amplifier 80. Maximum control voltages preferably are limited to prevent amplifier distortion and transducer damage under adverse conditions. The result is improved transient response time, dynamic damping and flattening of the response curve.

The voltage controlled amplifier 80 also has an additional input 82, which supplies alias frequency protection feedback (AFP) from the output of the amplifier arrangement. The purpose of this feedback will be explained in greater detail below. Moreover, its purpose is to reduce the gain of the voltage controlled amplifier in certain situations to prevent damage to the amplifier power switch stage 240.

The output of voltage controlled amplifier 80, which is the gain adjusted audio signal, is supplied, in the embodiment shown, to a pulse-width modulator 200, which pulse-width modulates the amplified audio signal to drive an isolation and driver stage 300 which drives a power switch 240. The output of the power switch 240 is provided to an output filter 260, the output of which drives the transducer 130. The power switch operates at a carrier frequency preferably of 500 KC. Output signals are provided by the output filter as the feedback signal 82 (AFP) and as a negative feedback signal 202 (NFB) to the pulse-width modulator 200. The purpose of signal NFB will be explained in greater detail below.

Although the embodiment shows a pulse width modulator and switching power amplifier, this arrangement is not the only type which can be used according to the invention. For example, a more conventional type of power amplifier arrangement could be used, for example, as shown in U.S. Pat. No. 4,868,870.

Figure 2:
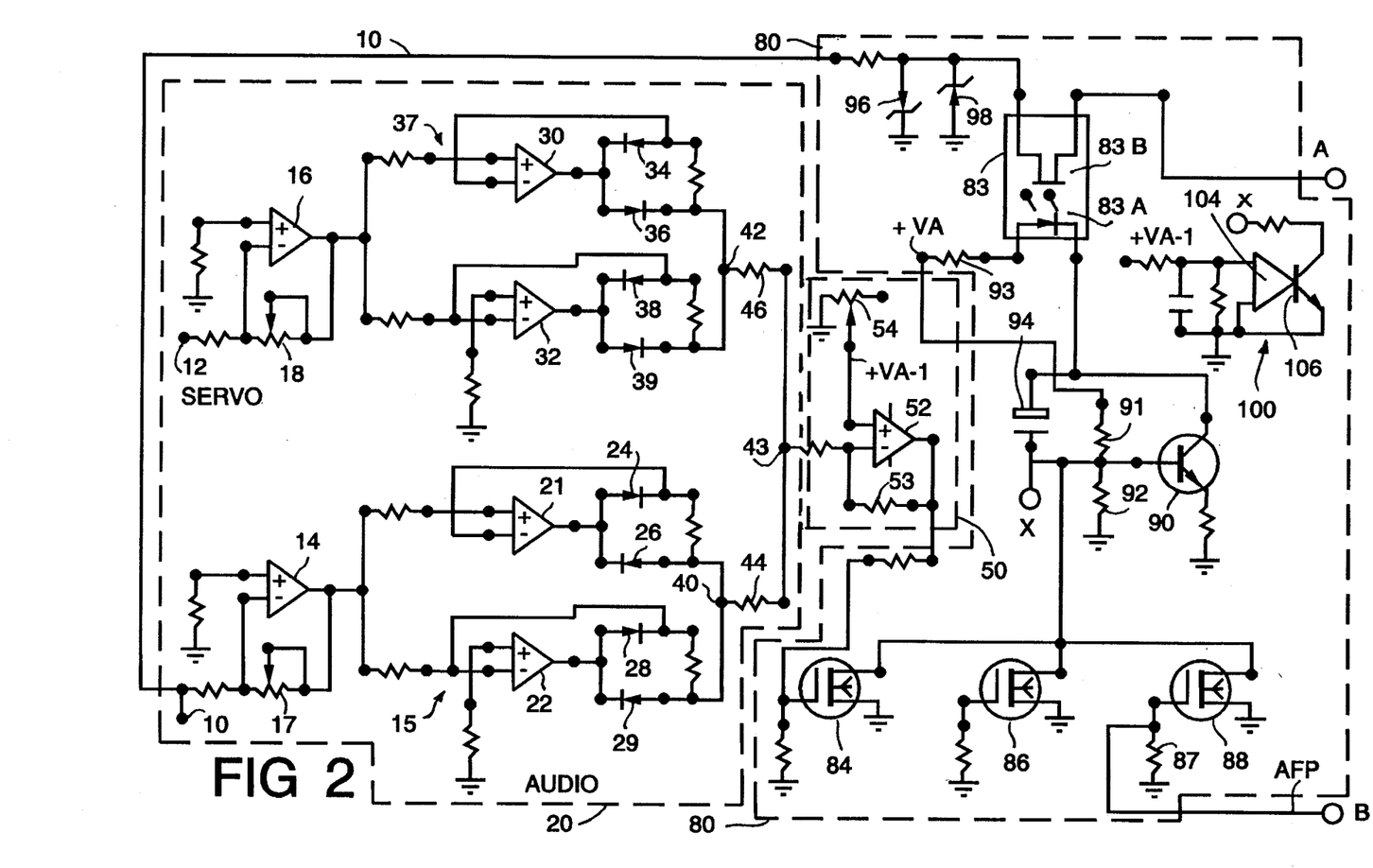
FIG. 2 is a schematic diagram of blocks 20 and 50 and a portion of block 80 of the block diagram of FIG. 1.

With reference now to FIG. 2, this figure shows blocks 20 and 50 and a portion 80A of block 80 of the block diagram of FIG. 1. Both audio input signal 10 and servo control signal 12 are coupled to the servo control circuit 20, which comprises a precision rectifier circuit. Circuit 20 includes operational amplifiers 14 and 16 which provide gain to the respective audio and servo signals, which gain can be adjusted by respective potentiometers 17 and 18. The output of operational amplifier 14 is fed to a full wave rectification stage 15 comprising operational amplifiers 21 and 22, and the output of operational amplifier 16 is fed to a full wave rectification stage 37 comprising operational amplifiers 30 and 32. The outputs of operational amplifiers 21, 22, 30 and 32 are coupled to diode pairs 24, 26; 28, 29; 34, 36; and 38, 39. The operational amplifiers 14 and 16 may be type LF351 and amplifiers 21, 22, 30 and 32 may be type TL074.

As indicated in FIG. 2, the output of operational amplifier 14 is coupled to the non-inverting input of operational amplifier 21 and the inverting input of operational amplifier 22. Similarly, the output of operational amplifier 16 is coupled to the non-inverting input of amplifier 30 and the inverting input of amplifier 32. As is evident, operational amplifier 21, in conjunction with the associated diodes 24 and 26, performs a precision half wave rectification function, allowing positive going portions of the output signal from operational amplifier 14 to be supplied to point 40. Operational amplifier 22, in conjunction with its diodes 28 and 29, performs a precision half wave rectification of negative going portions of the signal from operational amplifier 14 and supplies rectified signals to point 40. Accordingly, a full wave rectified version of the signal from operational amplifier 14 exists at point 40 in the circuit shown in FIG. 2. Essentially, this signal is a DC signal corresponding to the input audio signal. Precision rectification preferably is performed due to the low level of the audio signals being rectified, which generally is below typical semiconductor diode threshold levels.

Similarly, operational amplifier 30, in conjunction with its diodes 34 and 36, performs a precision half wave rectification of positive going portions of the servo-control signal from the output of operational amplifier 16 and operational amplifier 32, in conjunction with its diodes 38 and 39, performs a precision half wave rectification of negative going portions of the servo-control signal from operational amplifier 16. Accordingly, a full wave rectified version of the servo-control signal exists at point 42. Again, precision rectification is provided due to the low level of the servo-control signals.

Accordingly, a signal is developed at point 43 of the voltage divider comprising resistors 44 and 46 proportional to the difference between the signals developed at points 40 and 42. If the signals at points 40 and 42 are equal, and resistors 44 and 46 are the same value, a signal equal to the difference between the audio and servo signals at respective points 40 and 42 will be developed at point 43, namely, a zero voltage. When the audio and servo signals are unequal, then a voltage which is not zero is developed at point 43 proportional to the error between the two signals, i.e., the difference between the two signals.

The error signal at point 43 is fed to the inverting input of a comparator 52 of the comparator circuit 50. The comparator 52 comprises an operational amplifier, e.g. a type LF351. The non-inverting input of operational amplifier 52 is coupled to a potentiometer 54 which is used in setting the reference offset voltage for the comparator. In the illustrated embodiment, a supply voltage +VA-1 of 15 volts is used, and a voltage approximately equal to 7.5 volts or one-half the supply voltage is fed to the non-inverting input of comparator 52. Comparator 52 thus compares the voltage at point 43 with the reference voltage and provides a control signal to the gate of transistor 84 of voltage controlled amplifier 80. Due to feedback resistor 53, comparator 52 is provided with voltage gain, and thus voltages at point 43 of considerably lower signal level can be compared with the reference voltage at the non-inverting input.

Voltage controlled amplifier (VCA) 80 is comprised of two portions, portion 80A and portion 80B. Portion 80A includes transistors 84, 86, 88, 90 and optocoupler 83, which preferably is an optocoupler having an FET output circuit, for example, an H11F1 optocoupler manufactured by General Electric Co. Portion 80B comprises an operational amplifier circuit including operational amplifier 202. The voltage controlled amplifier 80 shown provides an improvement over the voltage controlled amplifier described in U.S. Pat. No. 4,868,870 because it has very low control voltage feedthrough and very wide gain control range. Furthermore, it provides a very inexpensive voltage controlled amplifier. The optocoupler shown has an input side 83A comprising a light emitting diode, and an output side 83B comprising an FET. The FET output side of the optocoupler is the actual gain control element. It controls the gain of operational amplifier 202 shown in FIG. 3. The impedance of the FET is controlled to vary the gain of the VCA. Transistor 90 serves as a constant current source which has a base bias which is modulatable by the error signal from the comparator 50. The base bias is set by resistors 91 and 92. A resistor 93 limits the maximum amount of current that can flow through the input diode of the optocoupler 83 as well as the maximum amount of current through the FET output side of the optocoupler 83. Capacitor 94 serves as an integrating capacitor for the error signal from the comparator 50. Zener diodes 96 and 98 clamp the audio signal below a preset level to prevent damage to the output of optocoupler 83 and to prevent feedthrough of spikes or other high voltage transients (positive or negative) to the amplifier circuit. Thus, these diodes provide electrostatic discharge protection. The gain cell of the optocoupler 83 also provides the advantage of DC coupling, unlike most VCA circuits which do not provide the ability to DC couple signals.

Transistors 84, 86 and 88 serve as input buffers to transistor 56. The inputs of transistors 84, 86 and 88 are isolated from each other. These inputs are isolated so that other inputs with different impedances can be used to control the gain of the VCA 80. The isolation of the transistors 86 and 88 allows them to operate as a summing amplifier for different inputs provided to these transistors. For example, additional precision rectifiers could be provided to the inputs of these transistors, for example, at the gate of transistor 86, or an aliasing frequency protection input for the output switching amplifier can be provided at one of these gates. This has actually been done in the circuit shown in FIG. 2. Transistor 88 has been provided with an aliasing frequency protection input in the form of feedback signal AFP which is provided from the output filter 260, to be described in greater detail below. Whichever of the transistors 84, 86 and 88 is turned on the most controls the gain of the amplifier the most. The transistors 84, 86 and 88 provide an extra degree of versatility to the voltage controlled amplifier and are not contained in the circuit shown in U.S. Pat. No. 4,868,870. Additional transistors could also be provided if further control of the amplifier gain is desired based on other factors.

As shown in FIG. 2, the output of comparator circuit 50 is provided to the gate of transistor 84. The output of transistor 84 as well as the outputs of the other transistors 86 and 88 are connected in common and provided to the base of the current source transistor 90 to modulate its base bias. The collector output of transistor 90 is then provided to the input of the optocoupler 83 which modulates the FET output of the optocoupler 83. The modulation of the FET output impedance controls the gain of operational amplifier 202 shown in FIG. 3. The audio signal 10 is provided in series with the FET output circuit 83B of the optocoupler and is amplified in accordance with the gain determined by the output of transistor 90, which acts as a current source which is modulated by the error signal fed to its base. Accordingly, an inexpensive voltage controlled amplifier has been provided. The optocoupler 83 has a low distortion characteristic which cannot be achieved with conventional voltage controlled amplifiers. Thus, VCA 80 essentially amplifies the audio signal in dependence on the gain set by transistor 90. If the current in the output circuit of transistor 90 is constant, the audio signal 10 coupled in the output circuit of optocoupler 83 will be amplified with constant gain by operational amplifier 202. However, due to the modulation of the current source formed by transistor 90 by the error signal between the audio signal 10 and the servo signal 12, the FET gain cell of optocoupler 83 is varied, thereby to control the gain of the amplifier arrangement.

An undervoltage sensing circuit 100 to prevent power on and off transients from entering the amplifier is also provided. The output of operational amplifier 104 is coupled to the base of a transistor 106, whose output circuit is coupled to the base of the transistor 90. The input of amplifier 104 is coupled to one of the voltage supplies (+VA-1). If the voltage supply fails, the base of transistor 90 will be driven low, turning transistor 90 off and limiting the current through the input of optocoupler 83.

The VCA 80 has the following advantages:

1. No control voltage feedthrough;
2. Audio can be D.C. coupled to the amplifier because of the lack of control voltage feed through;
3. Very wide gain control range;
4. Very low noise;
5. Auxiliary VCA control voltage inputs (transistors 86 and 88);
6. Prevents transients from entering the amplifier due to the undervoltage sensing circuit 100.

Figure 3:
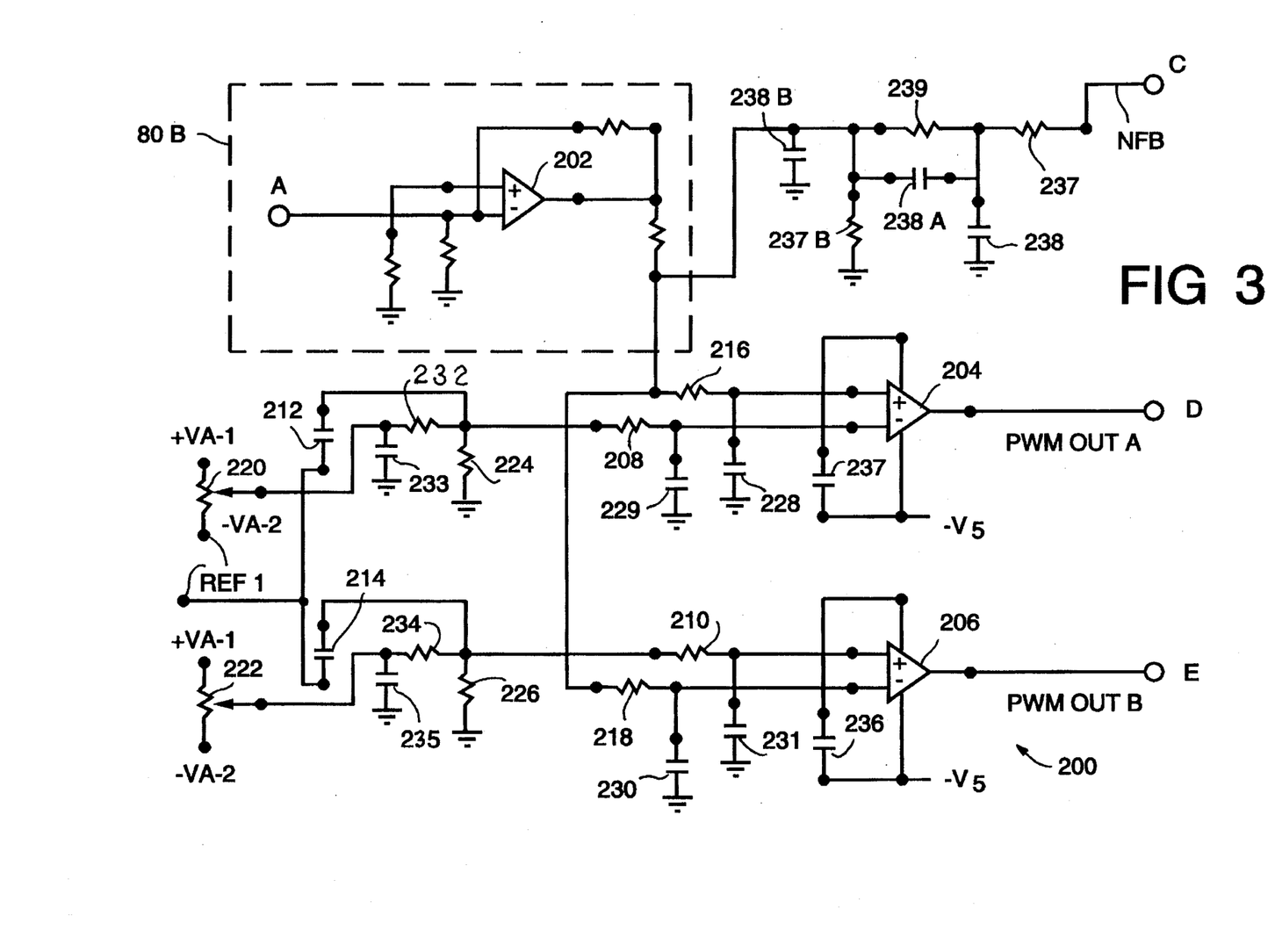
FIG. 3 is a schematic diagram of a portion of block 80 and of block 200 of FIG. 1.

The output from optocoupler 83 is provided to operational amplifier 202 of FIG. 3. The output of operational amplifier 202 is coupled to the pulse-width modulator 200 shown in schematic form in FIG. 3.

Figure 6:
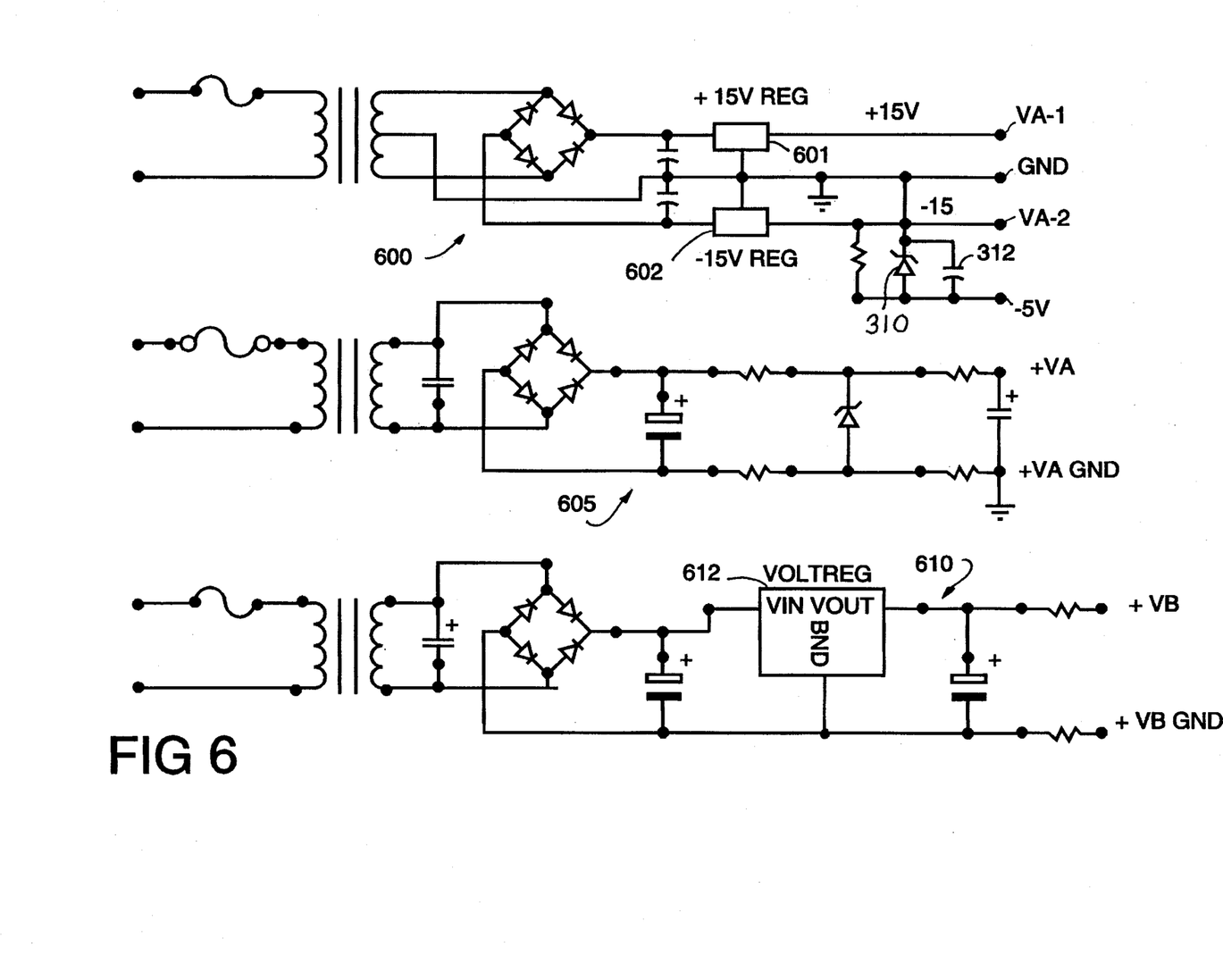
FIG. 6 is a schematic diagram of a power supply for portions of the present invention.
Figure 7:
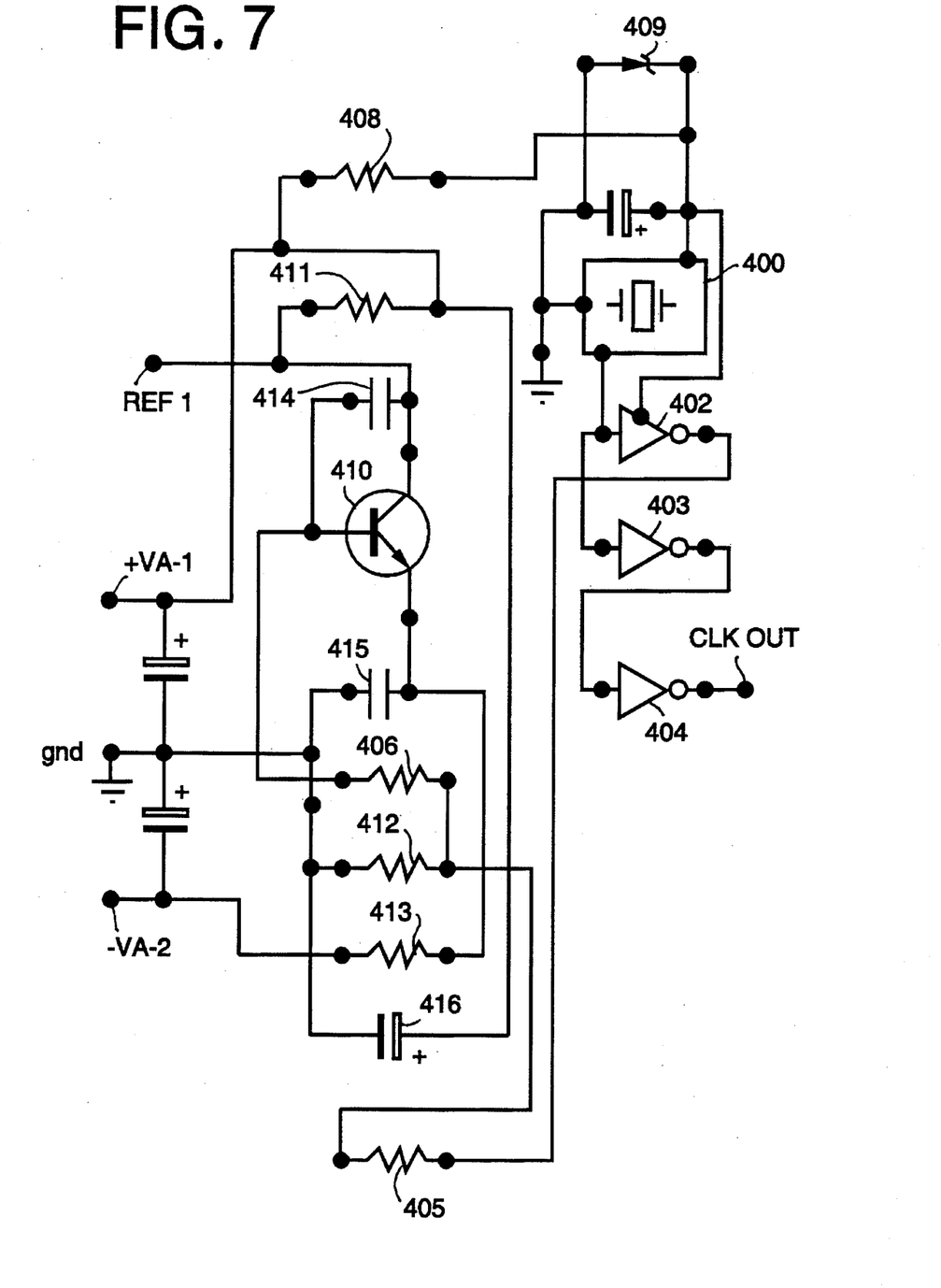
FIG. 7 is a schematic diagram of a clock and reference waveform supply for the present invention.

A pulse-width modulator essentially performs a form of analog-to-digital conversion. The output from the optocoupler 83 is provided to the input at point A of FIG. 3. Operational amplifier 202 may be a type LF351 and serves as an audio input buffer whose gain is controlled by the modulation of the FET output circuit 83B of optocoupler 83. The output of operational amplifier 202 is provided to comparators 204 and 206, which may be type LM710. A reference wave form REF 1 provided from the clock and reference waveform supply of FIG. 7 is provided through resistors 208 and 210, respectively, to the inverting input of comparator 204 and the non-inverting input of comparator 206. Capacitors 212 and 214 AC couple this waveform. This waveform serves as the reference voltage for the pulse-width modulator 200 and may be a 500 KC triangular waveform of 4VPP. The output of each of comparators 204 and 206 comprises a 50% duty cycle approximate square wave with an amplitude, in the embodiment shown using a supply voltage of 15 Volts, of about 5 Volts. If a positive going input voltage is fed to the non-inverting input of comparator 204 and the inverting input of comparator 206, via resistors 216 and 218, the duty cycle of the output of comparator 204 will increase and the duty cycle of the output of comparator 206 will decrease. Thus, comparators 204 and 206 form a push pull pulse-width modulator having a dead time (difference between the time comparator 204 output goes low and comparator 206 output goes high) that can be controlled by the DC bias voltage provided by potentiometers 220 and 222. Potentiometers 220 and 222, as shown, are connected between the positive and negative supply voltage plus +VA-1 and -VA-2, provided by the power supply shown in FIG. 6. This is used to control the amount of shoot through current in the power switch transistors 241 and 242 in the power switch 240 shown in greater detail in FIG. 5. Too much shoot through will damage transistors 241 and 242 of the power switch. If there is too little shoot through, this will cause high distortion in the output of the switching amplifier 240. Shoot through current will flow in a switching amplifier if the upper device 241 is not completely off when lower device 242 is turned on and vice versa.

With reference again to FIG. 3, capacitors 212 and 214 AC couple the reference triangle waveform through the respective decoupling resistors 208 and 210 to the comparators 204 and 206. Resistor 224 and resistor 226, respectively, provide a ground reference for the reference waveform. Capacitors 228, 229, 230 and 231 are decoupling capacitors to keep comparators 204 and 206 from oscillating. In the embodiment shown, the comparators 204 and 206 may be type LM710, which are prone to such oscillation due to their high speed. Resistor 232 and capacitor 233 and resistor 234 and capacitor 235, respectively, decouple the reference waveform REF 1, isolating it from the potentiometers 220 and 222 while allowing the D.C. level from the potentiometers to pass through to the comparator. Capacitors 236 and 237 function as power supply decoupling filters. A negative voltage -V5, which in the illustrated embodiment may be -5 Volts, is provided to comparators 204 and 206. With reference to FIG. 6, the voltage -V5 is provided from the negative voltage supply -VA-2 via a zener diode 310 coupled to filter 312.

A negative feedback (NFB) network is provided which couples negative feedback from the output filter 260 to the pulse-width modulator 200. The negative feedback network comprises resistor 237, capacitor 238, resistor 239, capacitor 238A and resistor 237A. Resistor 237 and capacitor 238 decouple switching noise created by the power switch 240, preventing such switching noise from entering the pulse-width modulator circuit. Resistor 239 and resistor 237A are used to set the amount of negative feedback and comprise a voltage divider. Capacitor 238A is for phase compensation. Capacitor 238B provides additional filtering and decoupling.

The purpose of the negative feedback (NFB) circuit is to provide negative feedback from the output of the amplifier power switch 240 thereby to reduce the audio signal fed to the signal pulse-width modulator comparators 204 and 206. The generation of the negative feedback signal NFB will be described in greater detail below.

Figure 4:
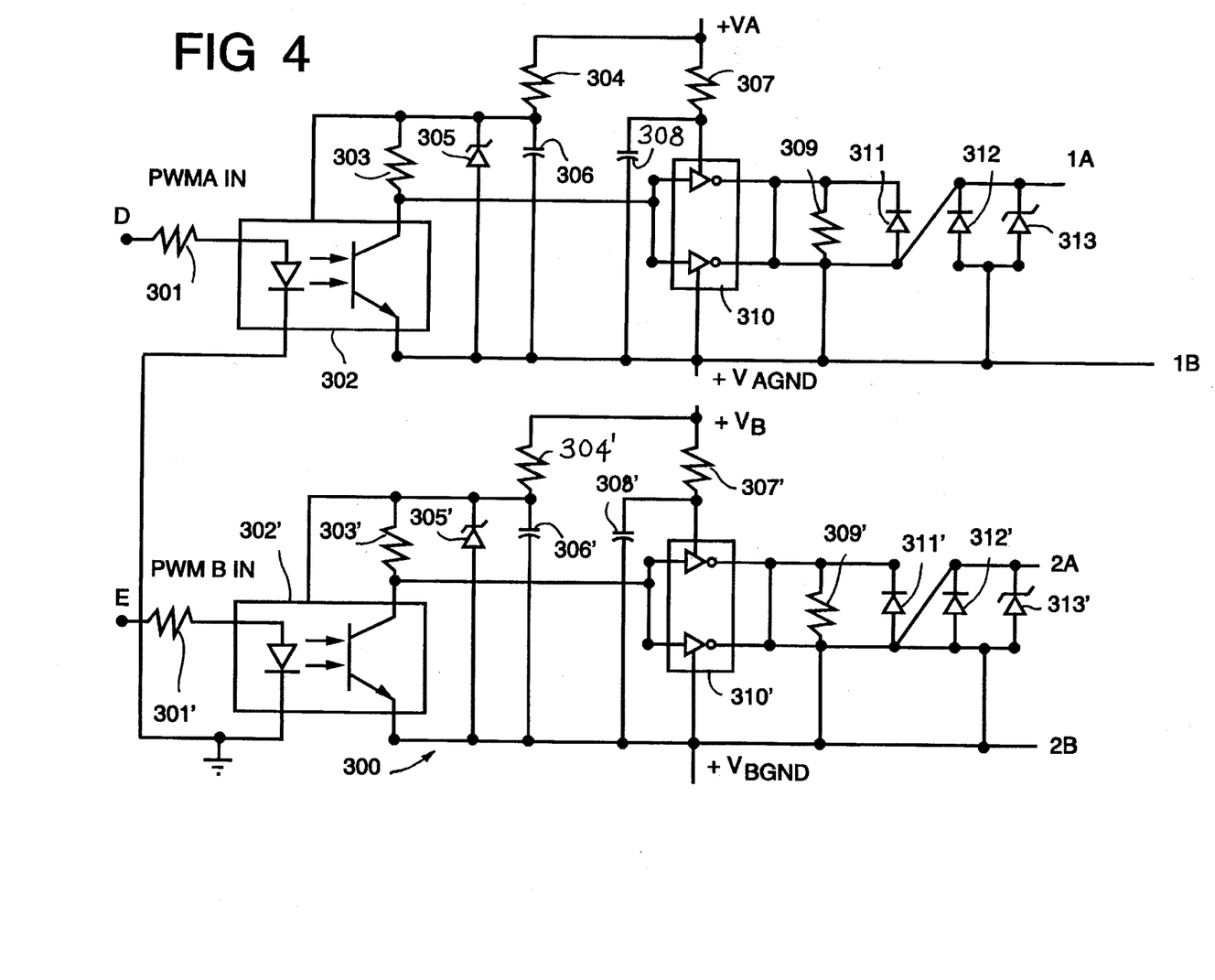
FIG. 4 is a schematic diagram of block 300 of FIG. 1.

The push-pull outputs (D and E) of the comparators 204 and 206 are provided to the isolation and driver circuit 300, shown in detail in FIG. 4. The audio signal has essentially been converted by the pulse-width modulator 200 into two push-pull signals D and E whose duty cycle represents the audio wave form. In the illustrated embodiment, the reference waveform REF 1 is a triangular waveform having a frequency of 500 kilocycles. Accordingly, the outputs D and E of the comparators 204 and 206 of the pulse-width modulator 200 have a frequency of 500 kilocycles whose duty cycle is modulated by the analog audio signal. The outputs of comparators 204 and 206 are approximate square wave signals whose duty cycle contains the audio signal information.

FIG. 4 shows the isolation and driver circuitry 300. The push-pull outputs D and E from the pulse-width modulator 200 are provided to optocouplers 302 and 302', respectively. The purpose of optocoupler 302 is to keep the 500 kilocycle high voltage switching waveform which is present at the source of switching transistor 241 of the power switch 240 shown in FIG. 5 from interfering with the operation of the pulse-width modulator section 200. Optocoupler 302' serves a similar purpose. It isolates the high source voltage of switching transistor 242 of FIG. 5 from interfering with the pulse-width modulator section 200. Both isolation and driver circuits for the respective push-pull signals D and E from the pulse-width modulator section are identical. They are, however, driven by different power supplies providing voltages +VA and +VB, shown in FIG. 6. The reason for this is that when driving a tandem series-connected pair of MOSFETS, such as the N channel MOSFETS 241 and 242 of the power switch of FIG. 5, the respective source connections are at different potentials. Accordingly, transistors 241 and 242 must be driven by separate circuits which are isolated from each other. Accordingly, the +VA ground +VAGND and the +VB ground +VBGND are unconnected to each other. See FIG. 4 and FIG. 6, the latter showing the power supplies.

With a positive potential applied to the input of optocoupler 302 through coupling resistor 301, the output of the optocoupler goes low. Optocoupler 302 may be a type HCPL 2601. The low output is coupled to the input of device 310 which is an inverting MOSFET gate driver, e.g. a type MC34151. With zero volts supplied to its input, its output goes high, turning on transistor 241 of FIG. 5. Resistor 303 serves as the open collector pull-up for the optocoupler 302. Resistor 304, zener diode 305 and capacitor 306 are used, illustratively, to derive a 5 Volt supply from the +15 Volt +VA supply voltage. Resistor 307 and capacitor 308 provide decoupling for driver 310. Resistor 309 is used to limit how quickly transistor 241 can be turned on. Diode 311 bypasses resistor 309 to turn transistor 241 off faster than it was turned on. This helps to limit voltage and current spikes in transistor 241. Diode 312 protects device 310 from reverse voltage should transistor 241 fail. Fuses 243 and 244 are also provided for protection. See FIG. 5. Diode 313 limits the amount of voltage at the gate of transistor 241.

The other driver circuit for transistor 242 is identical and functions in the exact same way and, accordingly, the same reference numerals with a prime (') designation have been employed. The only difference is that the driver circuit for the transistor 242 is coupled to the power supply +VB. A detailed explanation of its operation will not be repeated.

Figure 5:
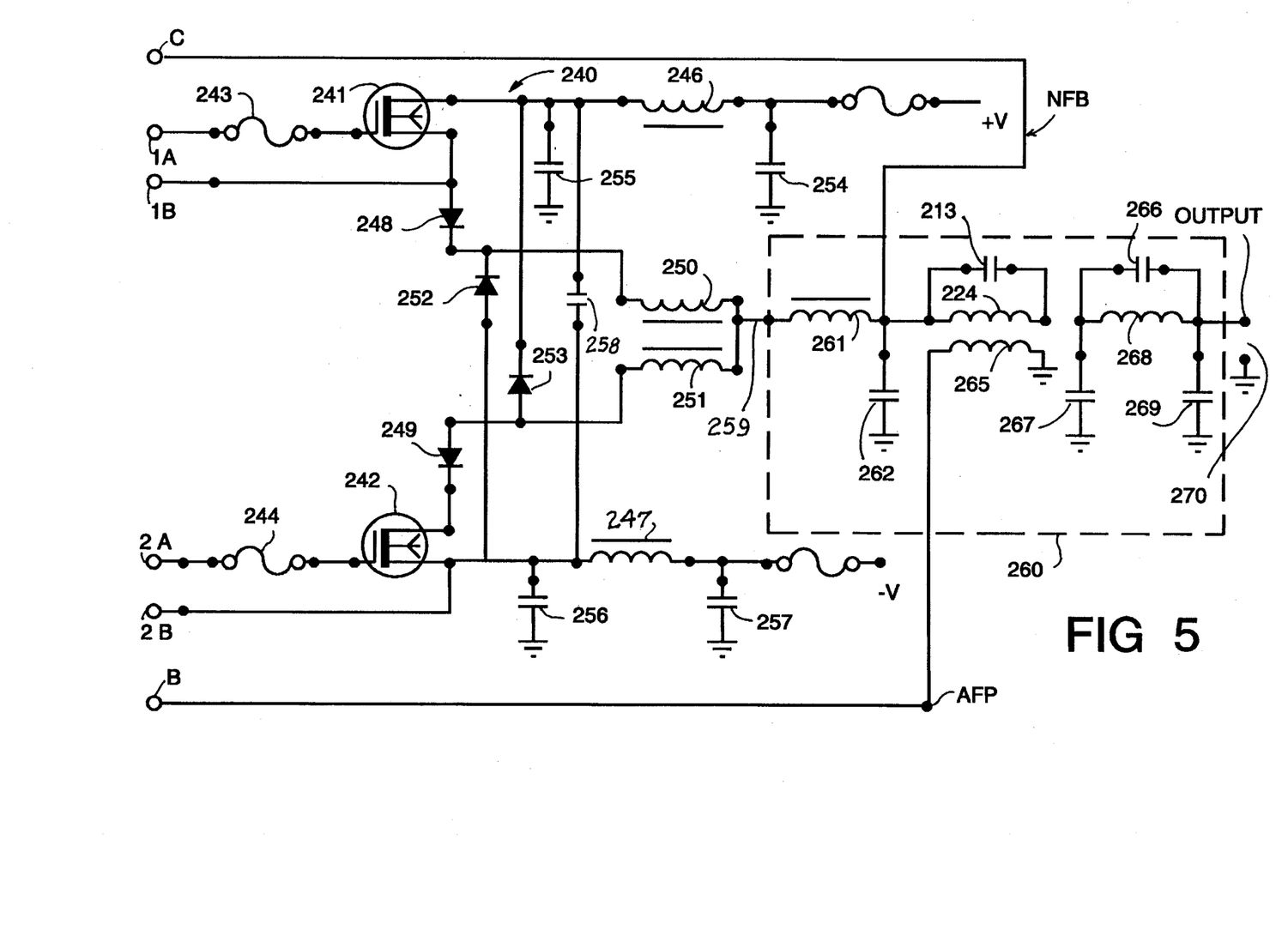
FIG. 5 is a schematic diagram of blocks 240 and 260 of FIG. 1.

FIG. 5 shows the power switch 240 which, as previously described, includes two N-channel power MOSFETs 241 and 242 driven by the respective driver circuits of FIG. 4. The inputs to the transistors 241 and 242 may be provided through respective protective fuses 243 and 244. The supply voltages +V and -V for the transistors 241 and 242, which are approximately ±100 volts, are supplied to the transistors through respective inductors 246 and 247. The outputs of each of the transistors 241 and 242 are provided through respective diodes 248 and 249 to windings 250 and 251. The windings 250 and 251 may be provided as separate air core windings. Alternatively, the outputs of windings 250 and 251 may be disposed on a common torroidal core. The two windings are coupled together and provided as the output to the output filter stage 260.

Power switch 240 operates as follows. When transistor 241 is turned on, the voltage at its source goes to +V, which in the illustrated embodiment is 100 Volts, from -V (-100 Volts). Inductor 250, coupled to the source of transistor 241 through diode 248 and inductor 251, coupled to the drain of transistor 242 through diode 249, may be wound as separate air core windings or wound on a single torroidal core. Inductors 250 and 251 limit how much current can flow through transistors 241 and 242 and prevent damage to these transistors from over-current spikes (di/dt). Diodes 252 and 253 clamp voltage spikes created by inductors 250 and 251 to the power supply voltages +V and -V. This protects transistors 241 and 242 from over voltage spikes (dv/dt). Diodes 248 and 249 prevent the body drain diodes of transistors 241 and 242 internal to all MOSFETs from conducting. When operating at high frequencies, this may be necessary to prevent the transistors 241 and 242 from being destroyed. Inductors 246 and 247 and capacitors 254, 255, 256, 257 and 258 provide power supply decoupling for the ±V supplies.

The output 259 from the power switch 240 is provided to the output filter 260 comprising inductor 261, capacitor 262, capacitor 263, inductors 264 and 265, capacitors 266 and 267, inductor 268 and capacitor 269. The output filter removes the high frequency pulse-width modulated encoded carrier which, in the illustrated embodiment, is 500 kilocycles, from the audio signal, i.e., it "detects" the audio. The input to inductor 261 is integrated by the capacitor 262 into its original form but, of course, amplified by the power switch 240, i.e., the inductor 261 and capacitor 262 integrate the pulse-width modulated duty cycle waveform into a conventional analog audio signal. Inductors 264 and 268 and capacitors 263, 266, 267 and 269 form an RF trap filter to remove any vestiges of the 500 kilocycle carrier signal.

To provide the switching amplifier with short circuit protection and alias frequency protection, the invention takes advantage of the voltage drop that occurs at frequencies above about 20 kilohertz across inductor 264. This also occurs across the inductor 268. This voltage drop, which increases as frequency increases, is measured by winding a sensing winding 265 around inductor 264. It could also be wound around inductor 268. This provides a signal that is proportional to the drop across inductor 264. Thus the combination of inductors 264 and 265 functions as an air core current transformer with a high pass filter connected in series with it. The signal in sensing winding 265 is provided to the gate of transistor 88 of the voltage controlled amplifier 80 shown in FIG. 2 as the signal AFP. Accordingly, if any high frequency signal above 30 kilohertz appears across inductor 265 that could damage the amplifier circuit, the gain of the amplifier is reduced to prevent damage. This is performed by the signal AFP which functions to turn transistor 88 on, which forces transistor 90 of VCA 80 to conduct less, thereby lowering the gain of the VCA 80 via the optocoupler 83. If a short circuit occurs at the output of the switching amplifier, a very fast rising spike is coupled back to transistor 88 of the VCA 80 which reduces the gain of the amplifier before damage can occur. If high frequencies above 50 kilohertz are allowed into the switching amplifier 240, it can be damaged.

Coils 264 and 265 may be constructed as follows: Coil 264 may comprise eight turns of #28 wire wound around coil 265. Coil 265 may comprise nine turns of #18 wire. The two form an air core transformer.

Turning to FIG. 2, the AFP signal is fed to the gate of transistor 88, which is coupled to ground through resistor 87. Resistor 87 controls the frequency point at which input signal (SFB) attenuation begins to occur. In addition to alias frequency protection, the signal SFB provides high di/dt protection in the power switch 240 by preventing the pulse width modulator from aliasing.

The output of the amplifier (NFB) can also be fed back into the servo input 12 to improve the switching amplifier 240 damping factor.

If the input signal frequency increases too much to be reproduced reliably, the input signal is thus attenuated. This eliminates the need for a filter at the input which saves expense and space and provides time delay savings. In addition, if the amplifier becomes unstable and begins to oscillate, which can be brought on by aliasing or a continuous short circuit at the output, the input signal will be reduced until the amplifier stops oscillating.

As shown in FIG. 5, the negative feedback signal NFB is provided back to the pulse width modulator 200, as previously described, to reduce the audio signal at the output of buffer 202 of the pulse width modulator of FIG. 3.

FIG. 6 shows the low level power supplies for the various circuits described. The high voltage power supplies for the voltages ±V in the power switch 240 are not shown. These are of conventional design.

The power supplies shown in FIG. 6 comprise one power supply providing the voltages +VA-1 and −VA-2 and indicated by 600 in FIG. 6. This supply uses a positive voltage regulator 601 and a negative voltage regulator 602, as known to those of skill in the art. In addition, a negative voltage −V5 is provided by a zener diode 601 coupled across capacitor 612, operating from the voltage −VA. Supply +VA-1 is preferably +15 V and supply −VA-2 is preferably −15 V. Supply −V5 is preferably −5 V. The operation of the power supply 600 is well known and will not be described in further detail.

Power supply 605 provides supply voltage +VA. Power supply 610 provides a separate voltage +VB, the embodiment shown having the same magnitude as the voltage +VA but isolated from it. Power supply 610 can be made identical to the portion of the power supply 600 providing the voltage +VA. Alternatively, as shown in FIG. 6, a regulator 612 can be provided for providing the voltage +VB. Similarly, a voltage regulator chip 612 can be provided for providing the voltage +VA.

FIG. 7 is a schematic diagram of the clock and reference waveform supply. This circuit provides the 500 kilocycle reference waveform REF 1 for the pulse-width modulator. The reference signal REF 1 is generated from an oscillator circuit 400 buffered by a buffer 402. The output of the buffer 402 is provided to a transistor 401 through resistors 405 and 406. Transistor 410 functions as an integrator to convert the square wave from the buffer 402 into a triangular waveform for the pulse-width modulator reference REF 1. Resistor 408 and diode 409 derive a plus 5 volt reference from the 15 volt reference +VA for the oscillator 400 as well as the buffers 402, 403, 404. Additional buffers 403 and 404 may be provided to produce a clock output. Resistors 405, 406, 411, 412 and 413 and capacitors 414, 415 and 416 in connection with transistor 410 form the triangle wave converter. Resistor 411 is the load resistor for transistor 410. Capacitor 414 is the integrator capacitor. Capacitor 415 is a by-pass capacitor. Resistor 406 provides input bias. Resistor 412 provides gain and resistor 413 provides bias. Capacitor 416 functions as a decoupling capacitor and resistor 405 provides additional output level control. Buffers 403 and 404 may be provided in the illustrated embodiment for driving additional amplifier modules, switching power supplies, etc.

The output 270 of the output filter 260 is provided to an output transducer 130, i.e., a loudspeaker, which is provided with an accelerometer 132 as in U.S. Pat. No. 4,868,870. The output transducer and accelerometer may be the same as shown in U.S. Pat. No. 4,868,870 and will not be described in further detail herein. The reader is directed to that patent for details, the disclosure of which is incorporated by reference herein.

Although the invention has been described with reference to a circuit using an accelerometer 132 mounted on transducer 130, the accelerometer can be eliminated. In such case, the servo input 12 can be provided with the signal NFB from the output of the power switch 240. Further, the output of another control circuit like circuit 20 could be provided to the gate of transistor 86. The servo input of this additional control circuit 20 can be coupled to the output of the power switch 240. This can be used to increase the damping factor of the amplifier itself without having to use large amounts of negative feedback NFB. The remaining servo input 12 of the original control circuit 20 can be coupled to the accelerometer 132.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded as illustrative rather than in a restricted sense.

What is claimed is:

1. An amplifier arrangement comprising:

a control circuit having an audio input and a control input, the control circuit producing an error signal proportional to the difference between the audio input and the control input;

a comparator receiving the error signal as an input and having a first reference signal as an input and producing a comparator output signal comprising a gain control signal for an amplifier circuit;

an amplifier circuit having said audio signal as an input and further having a gain responsive to the comparator output signal, the amplifier circuit having an output;

a pulse width modulator circuit having said amplifier circuit output as an input, the pulse width modulator circuit converting an amplified audio signal comprising the output of said amplifier circuit into a pulse width modulated signal whose duty cycle represents audio information in said audio signal;

a power amplifier switching circuit receiving the pulse width modulated signal, the output of the power amplifier comprising an amplified pulse width modulated signal; and an output filter receiving the amplified pulse width modulated signal, the output filter converting the amplified pulse width modulated signal into an amplified audio signal substantially reproducing said input audio signal but at an increased gain and adapted to be coupled to an output transducer.

2. The amplifier arrangement of claim 1, wherein said amplifier circuit comprises a voltage controlled amplifier whose gain is controlled by said comparator output.

3. The amplifier arrangement of claim 2, wherein said voltage controlled amplifier comprises:

an amplifier;

an optocoupler, the optocoupler having an input circuit and an output circuit, the input circuit and output circuit having an electrically isolated signal path, the input circuit being coupled to the comparator output, the output circuit being coupled to the audio input and comprising a gain control element for controlling the gain of the amplifier, the gain control element being controlled by the input circuit via an optical link of said optocoupler.

4. The amplifier arrangement of claim 3, further comprising a modulated current source coupling said comparator output to said input circuit of the optocoupler, said current source being modulated by said comparator output to control the gain control element of said optocoupler output circuit.

5. The amplifier arrangement of claim 4, wherein the amplifier has an input coupled to the optocoupler output circuit, the amplifier having a gain varied by the gain control element of the optocoupler output circuit.

6. The amplifier arrangement of claim 4, wherein the output circuit comprises an FET of the optocoupler.

7. The amplifier arrangement of claim 4, further comprising at least one buffer stage coupling said comparator output and said current source.

8. The amplifier arrangement of claim 7, further comprising at least one further buffer stage having an output coupled to said current source, the further buffer stage having a control input for coupling to a further control signal.

9. The amplifier arrangement of claim 1, wherein the control circuit comprises a precision rectifier circuit, including one precision rectifier circuit for rectifying the audio input and another precision rectifier circuit for rectifying the control input.

10. The amplifier arrangement of claim 4, further comprising a supply voltage under-voltage detection circuit having an input coupled to the supply voltage and an output coupled to said current source for controlling the current source and the gain of the amplifier circuit thereby to suppress transients.

11. The amplifier arrangement of claim 1, further comprising a carrier reference supply, the carrier reference supply having an output comprising a reference waveform for modulation by the amplified audio signal in said pulse width modulator.

12. The amplifier arrangement of claim 11, wherein the carrier reference waveform comprises a triangle signal.

13. The amplifier arrangement of claim 1, further comprising a driver circuit coupling the output of said pulse width modulator circuit and the input of said power amplifier switching circuit.

14. The amplifier arrangement of claim 13, wherein said driver circuit comprises an isolation circuit for electrically isolating said pulse width modulator circuit from said power amplifier switching circuit.

15. The amplifier arrangement of claim 14, wherein said isolation circuit comprises a further optocoupler having an input and an output, the input coupled to the output of the pulse width modulator and the output coupled to a driver stage of said driver circuit, the driver stage being coupled to said power amplifier switching circuit.

16. The amplifier arrangement of claim 13, wherein the output of said pulse width modulator comprises a pair of push-pull outputs.

17. The amplifier arrangement of claim 16, further comprising a driver circuit coupling each of said push-pull outputs to said power amplifier switching circuit.

18. The amplifier arrangement of claim 1, wherein said output filter comprises a circuit for removing a reference carrier waveform signal from the amplified pulse width modulated output signal of said power amplifier switching circuit.

19. The amplifier arrangement of claim 18, further comprising a feedback output from said output filter comprising a signal coupled to said amplifier circuit for reducing the gain of said amplifier circuit in the event a high frequency aliasing signal in the ultrasonic spectrum appears at the output of said power amplifier switching circuit.

20. The amplifier arrangement of claim 19, wherein said output filter comprises a current transformer for producing the feedback output.

21. The amplifier arrangement of claim 18, further comprising a negative feedback output from said power amplifier switching circuit coupled to said pulse width modulator for reducing the level of said audio signal to provide damping.

22. The amplifier arrangement of claim 1, wherein the control input is coupled to a transducer mounted to a moving element of the output transducer.

23. The amplifier arrangement of claim 1, wherein the control input is coupled to an output of the power amplifier switching circuit.

24. An amplifier arrangement comprising:

a control circuit having an audio input and a control input, the control circuit producing an error signal proportional to the difference between the audio input and the control input;

a comparator receiving the error signal as an input and having a first reference signal as an input and producing a comparator output signal comprising a gain control signal for an amplifier circuit;

an amplifier circuit having said audio signal as an input and further having a gain responsive to the comparator output signal, the amplifier circuit having an output and comprising a voltage controlled amplifier whose gain is controlled by the comparator output signal, the voltage controlled amplifier comprising an optocoupler and an amplifier, the optocoupler having an input circuit and an output circuit, the input circuit and output circuit having an electrically isolated signal path, the input circuit being coupled to the comparator output, the output circuit being coupled to the audio input and to the amplifier and comprising a gain control element for controlling the gain of the amplifier, the gain control element being controlled by the input circuit via an optical link of said optocoupler; and a power amplifier circuit receiving the output signal from said amplifier circuit, the output of the power amplifier circuit comprising an amplified signal adapted to be coupled to an output transducer.

25. The amplifier arrangement of claim 24, further comprising:

a pulse width modulator circuit having said amplifier circuit output as an input, the pulse width modulator circuit converting an amplified audio signal comprising the output of said amplifier circuit into a pulse width modulated signal whose duty cycle represents audio information in said audio signal; and wherein the power amplifier comprises a power amplifier switching circuit receiving the pulse width modulated output signal and providing an output comprising an amplified pulse width modulated signal.

26. The amplifier arrangement of claim 25, further comprising:

an output filter receiving the amplified pulse width modulated signal, the output filter converting the amplified pulse width modulated signal into an amplified audio signal substantially reproducing said input audio signal but at an increased gain and adapted to be coupled to the output transducer.

27. The amplifier arrangement of claim 24, further comprising a modulated current source coupling said comparator output to said input circuit of the optocoupler, said current source being modulated by said comparator output to control the gain of said optocoupler output circuit.

28. The amplifier arrangement of claim 27, wherein the amplifier has an input coupled to the optocoupler output circuit, the amplifier having a gain varied by the gain control element of the optocoupler output circuit.

29. The amplifier arrangement of claim 27, wherein the output circuit comprises an FET of the optocoupler.

30. The amplifier arrangement of claim 27, further comprising at least one buffer stage coupling said comparator output and said current source.

31. The amplifier arrangement of claim 30, further comprising at least one further buffer stage having an output coupled to said current source, the further buffer stage having a control input for coupling to a further control signal.

32. The amplifier arrangement of claim 24, wherein the control circuit comprises a precision rectifier circuit, including one precision rectifier circuit for rectifying the audio input and another precision rectifier circuit for rectifying the control input.

33. The amplifier arrangement of claim 24, further comprising a supply voltage under-voltage detection circuit having an input coupled to the supply voltage and an output coupled to said current source for controlling the current source and the gain of the amplifier circuit thereby to suppress transients.

34. The amplifier arrangement of claim 25, further comprising a carrier reference supply, the carrier reference supply having an output comprising a reference waveform for modulation by the amplified audio signal in said pulse width modulator.

35. The amplifier arrangement of claim 34, wherein the carrier reference waveform comprises a triangle signal.

36. The amplifier arrangement of claim 25, further comprising a driver circuit coupling the output of said pulse width modulator circuit and the input of said power amplifier switching circuit.

37. The amplifier arrangement of claim 36, wherein said driver circuit comprises an isolation circuit for electrically isolating said pulse width modulator circuit from said power amplifier switching circuit.

38. The amplifier arrangement of claim 37, wherein said isolation circuit comprises a further optocoupler having an input and an output, the input coupled to the output of the pulse width modulator and the output coupled to a driver stage of said driver circuit, the driver stage being coupled to said power amplifier switching circuit.

39. The amplifier arrangement of claim 36, wherein the output of said pulse width modulator comprises a pair of push-pull outputs.

40. The amplifier arrangement of claim 39, further comprising a driver circuit coupling each of said push-pull outputs to said power amplifier switching circuit.

41. The amplifier arrangement of claim 26, wherein said output filter comprises a circuit for removing a reference carrier waveform signal from the amplified pulse width modulated output signal of said power amplifier switching circuit.

42. The amplifier arrangement of claim 41, further comprising a feedback output from said output filter comprising a signal coupled to said amplifier circuit for reducing the gain of said amplifier circuit in the event a high frequency aliasing signal in the ultrasonic spectrum appears at the output of said power amplifier switching circuit.

43. The amplifier arrangement of claim 42, wherein said output filter comprises a current transformer for producing the feedback output.

44. The amplifier arrangement of claim 41, further comprising a negative feedback output from said power amplifier switching circuit coupled to said pulse width modulator for reducing the level of said audio signal to provide damping.

45. The amplifier arrangement of claim 24, wherein the control input is coupled to a transducer mounted to a moving element of the output transducer.

46. The amplifier arrangement of claim 24, wherein the control input is coupled to an output of the power amplifier switching circuit.

47. An amplification method comprising:

receiving an input audio signal and a control signal and producing an error signal proportional to the difference between the audio and the control signal;

comparing the error signal to a first reference signal and producing a comparison signal comprising a gain control signal;

amplifying said input audio signal with a gain responsive to the comparison signal and producing an amplified signal;

converting the amplified signal into a pulse width modulated signal whose duty cycle represents audio information in said audio signal;

power amplifying the pulse width modulated signal into an amplified pulse width modulated signal; and filtering the amplified pulse width modulated signal to convert the amplified pulse width modulated signal into an amplified audio signal substantially reproducing said input audio signal but at an increased gain and adapted to be coupled to an output transducer.

48. The method of claim 47 wherein said step of amplifying comprises amplifying with a voltage controlled amplifier whose gain is controlled by said comparison signal.

49. The method of claim 48, wherein said step of amplifying with a voltage controlled amplifier comprises:

providing an optocoupler having an input circuit and an output circuit, the input circuit and output circuit having an electrically isolated signal path, supplying the input audio signal to be amplified to the output circuit; and supplying a control voltage comprising the comparison signal for controlling the amplifier gain to the input circuit and controlling a gain control element of the output circuit with said control voltage via an optical link of said optocoupler.

50. The method of claim 49, further comprising modulating a current source coupling the control signal and the input circuit of the optocoupler to control the gain control element of said optocoupler output circuit.

51. The method of claim 50, further comprising controlling the gain of an amplifier coupled to the gain control element by controlling said gain control element.

52. The method of claim 51, wherein the step of controlling the gain control element comprises controlling an FET of the optocoupler.

53. The method of claim 50, further comprising providing at least one buffer stage coupling said comparison signal and said current source.

54. The method of claim 53, further comprising providing at least one further buffer stage having an output coupled to said current source, the further buffer stage having a control input for coupling to a further control signal.

55. The method of claim 47, wherein the step of providing an error signal comprises rectifying said audio signal and the control signal and forming the difference between the recitified signals.

56. The method of claim 47, further comprising electrically isolating the pulse width modulated signal prior to power amplifying the pulse width modulated signal.

57. The method of claim 47, wherein said step of filtering comprises removing the audio waveform signal from the power amplified pulse width modulated signal.

58. The method of claim 57, further comprising providing a feedback output signal from said power amplified pulse width modulated signal for reducing the gain of said amplifying step in the event a high frequency aliasing signal in the ultrasonic spectrum appears in said power amplified pulse width modulated signal.

59. The method of claim 57, further comprising providing a negative feedback output signal from said power amplified pulse width modulated signal to reduce the level of said audio signal to provide damping.

60. The method of claim 57, further comprising generating the control signal with a servo transducer mounted to a moving element of the output transducer to compensate for output transducer nonlinearities.

61. The method of claim 47, further comprising providing a feedback signal from said power amplified pulse width modulated signal as said control signal.

62. An amplification method comprising:

receiving an input audio signal and a control signal and producing an error signal proportional to the difference between the audio signal and the control signal;

comparing the error signal to a first reference signal and producing a comparison signal comprising a gain control signal;

amplifying said input audio signal with a voltage controlled amplifier having a gain responsive to the comparison signal, the step of amplifying with a voltage controlled amplifier comprising providing an optocoupler having an input circuit and an output circuit, supplying the audio signal to the output circuit, supplying a control voltage comprising the comparison signal for controlling the amplifier gain to the input circuit, the input circuit and output circuit having an electrically isolated signal path, and controlling a gain control element of the output circuit with said control voltage via an optical link of said optocoupler to control the gain of the voltage controlled amplifier; and power amplifying the amplified signal to produce a power amplified signal adapted to be coupled to an output transducer.

63. The method of claim 62, further comprising:

converting the amplified audio signal into a pulse width modulated signal whose duty cycle represents audio information in said audio signal; and wherein the step of power amplifying comprises receiving the pulse width modulated signal and providing an output comprising an amplified pulse width modulated signal.

64. The method of claim 63, further comprising:

filtering the amplified pulse width modulated signal to convert the amplified pulse width modulated signal into an amplified audio signal substantially reproducing said input audio signal but at an increased gain and adapted to be coupled to the output transducer.

65. The method of claim 62, further comprising modulating a current source coupling said control signal and the input circuit of the optocoupler to control the gain of said optocoupler output circuit.

66. The method of claim 1, wherein the step of controlling the gain of the voltage controlled amplifier comprises controlling the gain control element so as to adjust the gain of an amplifier coupled to the gain control element.

67. The method of claim 66, wherein the step of controlling the gain control element comprises controlling an FET of the optocoupler.

68. The method of claim 65, further comprising providing at least one buffer stage coupling said comparison signal and said current source.

69. The method of claim 68, further comprising providing at least one further buffer stage having an output coupled to said current source, the further buffer stage having a control input for coupling to a further control signal.

70. The method of claim 62, wherein the step of providing an error signal comprises rectifying said input audio signal and said control signal and forming the difference between the rectified signals.

71. The method of claim 63, further comprising electrically isolating the pulse width modulated signal prior to power amplifying the pulse width modulated signal.

72. The method of claim 64, wherein said step of filtering comprises removing a reference carrier waveform signal from the amplified pulse width modulated signal.

73. The method of claim 72, further comprising providing a feedback output signal from said power amplified pulse width modulated signal for reducing the gain of said amplifying step in the event a high frequency aliasing signal in the ultrasonic spectrum appears in said power amplified pulse width modulated signal.

74. The method of claim 72, further comprising providing a negative feedback output signal from said power amplified pulse width modulated signal to reduce the level of said audio signal to provide damping.

75. The method of claim 62, further comprising generating the control signal from a servo transducer mounted to a moving element of the output transducer to compensate for output transducer nonlinearities.

76. The method of claim 63, further comprising providing a feedback signal from said power amplified pulse width modulated signal as said control signal.

\* \* \* \* \*